(12) United States Patent  
Martin

(10) Patent No.: US 7,375,636 B1  
(45) Date of Patent: May 20, 2008

(54) APPARATUS AND METHOD FOR REAL TIME FUNCTIONAL TESTING OF RFID TAGS

(76) Inventor: Lawrence Joseph Martin, 4143 Red Tail Run, Efland, NC (US) 27243

( * ) Notice: Subject to any disclaimer, the term of this patent is extended or adjusted under 35 U.S.C. 154(b) by 206 days.

(21) Appl. No.: 11/294,627

(22) Filed: Dec. 5, 2005

(51) Int. Cl.  
*G08B 13/14* (2006.01)

(52) U.S. Cl. ............... 340/572.1; 340/572.4; 340/572.7; 340/572.8; 340/539.1; 340/825.69; 340/825.72

(58) Field of Classification Search ........... 340/572.1, 340/572.3, 572.4, 572.7, 572.8, 10.1, 10.3, 340/539.1, 825.69, 825.72; 702/55, 57; 342/41, 342/42  
See application file for complete search history.

(56) References Cited

U.S. PATENT DOCUMENTS

| | | | |
|---|---|---|---|
| 6,429,831 B2 | 8/2002 | Babb | |
| 6,451,154 B1 | 9/2002 | Grabau | |
| 6,535,175 B2 | 3/2003 | Brady | |
| 6,644,771 B1 * | 11/2003 | Silverbrook | 347/19 |
| 6,780,265 B2 | 8/2004 | Bleckmann | |
| 6,784,789 B2 | 8/2004 | Eroglu | |
| 6,827,817 B2 | 12/2004 | Bleckmann | |
| 6,850,080 B2 | 2/2005 | Hiroku | |
| 6,940,408 B2 | 9/2005 | Ferguson | |
| 2003/0136503 A1 | 7/2003 | Green | |
| 2005/0159906 A1 | 7/2005 | Tada | |
| 2005/0280537 A1 * | 12/2005 | Feltz et al. | |

* cited by examiner

Primary Examiner—Hung Nguyen

(57) ABSTRACT

A highly efficient and versatile system for high speed functional testing of finished RFID tags. Common materials are used in key areas, like the antenna enclosure 3a and 3b, to cut the cost of the system. A standard RFID reader (11) is used along with a real time microcontroller (13) and sensors (5, 7) to test each tag on a continuous web (21) good or bad. Bad tags can be ignored, marked, or removed from the web. The system is designed to be mounted to existing press and rewind equipment, enabling an incremental investment in RFID technology.

6 Claims, 5 Drawing Sheets

APPARATUS AND METHOD FOR REAL TIME FUNCTIONAL TESTING OF RFID TAGS

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

1. Field of Invention

This invention generally relates to the production of Radio Frequency Identification Device (RFID) tags, specifically to the reliable testing of finished RFID tags and labels at high speed in a production environment.

2. Prior Art

RFID tags and labels have a combination of antennas and analog and/or digital electronics, which may include for example communications electronics, data memory, and control logic. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. Nos. 6,850,080 (Hiroki 2005), 6,429,831 (Babb 2002), 6,940,408 (Ferguson et al. 2005), 6,784,789 (Eroglu et al. 2004), 6,535,175 (Brady et al. 2003), 6,827,817 (Bleckmann et al. 2004), 6,780,265 (Bleckmann et al. 2004), and 6,451,154 (Grabau et al. 2002).

RFID tags are wireless devices which communicate only with wireless base stations. Those base stations are commonly called RFID readers.

Radio Frequency Identification Device (RFID) tags are manufactured through the execution of a number of steps:

(a) Integrated Circuit (IC) chips are manufactured and tested. The testing is performed according to many methods, including those disclosed in U.S. Pat. Nos. 6,850,080 (Hiroki 2005) and 6,429,831 (Babb 2002).

(b) The IC chips are attached to antennas. The resulting assemblies, commonly called "inlays," are tested. Testing is performed according to many methods, including those disclosed in U.S. Pat. Nos. 6,940,408 (Ferguson et al. 2005), 6,784,789 (Eroglu et al. 2004) and 6,535,175 (Brady et al. 2003). Most tests on inlays are performed with specialized, expensive, equipment that measures the electrical characteristics of the inlay rather than performing a direct functional test of the finished inlay. Tested Inlays are commonly delivered as a continuous web, on a roll, for further processing.

(c) Inlays are cut from the roll and inserted into paper labels, cloth labels, plastic housings and other assemblies needed for various applications, through a process generally called "conversion." The resulting assemblies, commonly called "tags," are tested. Testing is performed according to many methods, including a number of slow, labor intensive methods described below. Finished RFID tags are commonly delivered as a continuous web, on a roll, for further processing. U.S. Pat. Nos. 6,827,817 (Bleckmann et al. 2004) and 6,780,265 (Bleckmann et al. 2004) disclose methods for manufacturing RFID tags but do not discuss testing. U.S. Pat. No. 6,451,154 (Grabau et al. 2002), "RFID Manufacturing Concepts," states minimally, "The paper web moves past a station where conventional RFID read/writer equipment is provided. The equipment practices at least one of verifying the functionality of, or programming, the chips of inlets prior to the formation of a composite web," this being the only mention of testing in the patent. Such functional testing is not trivial or obvious to implement. This patent does not disclose enough information to develop an effective subsystem for RFID tag testing.

Common Practices

Many enterprises pass finished RFID tags in front of an RFID reader and employ technicians to watch lights or other indicators that show that each tag is being read. Each tag that fails to read is then immediately replaced by the technician, or marked for later replacement. These manual test methods, while very slow and labor intensive, are widely used because they incur very low equipment cost on the enterprise.

Several vendors of RFID equipment have included in their equipment the ability to perform actions based on logical triggers. Some of these vendors have attempted to create RFID test systems by connecting an optical gap sensor to the trigger input of such an RFID reader. The theory of operation of such a system is that the gap between labels can drive the timing of any testing that needs to be done. However, those systems have a number of weaknesses. Most of those weaknesses involve timing and electrical requirements associated with the support of sensors and actuators. For example, the trigger inputs of most RFID readers are not fast enough to react to the signal produced by an optical gap sensor when the interlabel gap moves past the sensor at the high speeds common to production environments. One very important weakness of such a setup is the spatial relationship between the interlabel gap and the RFID tag within the label. An RFID test system based solely on optical gap sensing with no position detection will require constant mechanical adjustment of the optical gap sensor to accommodate physical differences between production runs. Further, such systems do not control the timing of their outputs. The RFID reader replies when its programmed actions are complete, with no regard for the timing requirements of the system to which it is connected. Some have proposed extending this design philosophy to the marking of bad RFID tags, simply by connecting a marker to the "bad tag" signal output of the RFID reader. For all the reasons above, this will not work fast enough or consistently enough for production environments.

Many enterprises purchase and use a special tester for RFID tags. These testers commonly incorporate mechanisms for positioning individual RFID tags on a continuous web in front of an RFID reader. The reader, controlled by a separate computer, then performs a series of tests on each RFID tag to be so positioned. At the end of the test, the web is advanced to the next tag position. Each tag that fails the test is marked for later replacement. This special purpose RFID test device has a number of disadvantages:

(a) Since the continuous web of RFID tags must be stopped in order to test each tag, the system wastes a lot of time stopping and restarting the continuous web.

(b) Since the tests are controlled by a separate computer, the system wastes a lot of time sending the same commands to the RFID reader for each tag tested.

(c) Since the tester is a separate device that stands alone from other devices, workers must transfer rolls of RFID tags to and from this device.

Antennas and Shielding

One challenge faced by designers of short range RFID systems, including test systems, printers, and label applicators, is antenna design. Most short range RFID systems use a small antenna similar in size to the RFID tag itself. These antennas must generally be positioned very close to the RFID tag in order to function correctly. That means that each tag must stop in front the antenna for the duration of the test, which further implies that no device based on these small antennas can be operated with continuous web motion.

Another challenge faced by designers of short range RFID systems, including test systems, printers, and label applicators, is antenna shielding. If one and only one RFID tag is to be tested, all other tags in the vicinity must be shielded from the reader, or the reader must be shielded from them. Most designs use reflective metal surfaces, absorptive ferrite materials, or a combination of reflective and absorptive elements. The approach has a number of drawbacks, including excess RF reflections, complexity and cost.

OBJECTS AND ADVANTAGES

Accordingly, several objects and advantages of this RFID Tag Test System are:

(a) The RFID Tag Test System makes use of standard, commercially available RFID readers to perform functional tests of RFID tags.

(b) The RFID Tag Test System normally operates with continuous web motion, allowing the highest possible throughput on a given device.

(c) The RFID Tag Test System takes advantage of the ability of many RFID readers to perform autonomous actions in response to digital input signals, without waiting for control messages from a separate computer.

(d) The RFID Tag Test System senses the position of RFID tags relative to its own antenna to precisely determine the correct timing of its outputs, in contrast to simpler test systems where the timing is based only on an optical gap sensor.

(e) The RFID Tag Test System can be easily attached to the equipment that manufactures finished RFID tags, notably conversion presses, slitter/rewinders, and rewind tables, allowing RFID tags to be manufactured and tested in one operation.

(f) The RFID Tag Test System uses larger antennas more commonly used for long range RFID applications. These antennas provide better performance at a lower cost than the small antennas used in the prior art.

(g) The RFID Tag Test System uses commonly available materials in order to control RF energy. This provides a cost savings over the use of specialized RF absorptive materials by the prior art.

Further objects and advantages will become apparent from a consideration of the ensuing description and drawings.

SUMMARY

This RFID Tag Test System allows the functional test of one and only one RFID tag at any given instant, at high speed, in continuous motion, with standard RFID readers. This invention also cuts costs through the use of less specialized materials than the prior art. This invention, further, improves the workflow of the RFID tag manufacturing by reducing the number of human processing steps.

DRAWINGS

Figures

DRAWINGS

Reference Numerals

1 Antenna
3a Antenna Baffle, Upstream
3b Antenna Baffle, Downstream
5 Position Sensor (Shaft Encoder)
7 Optical Sensor
9 Marker
11 RFID Reader
13 Real Time Microcontroller
15 Human Machine Interface (HMI)
17 Host Machine Controller, not part of this RFID Tag Test System
19 RFID Test Area, between baffles
21 Continuous Paper Web, not part of this RFID Tag Test System
23 Paper Label, Typical, not part of this RFID Tag Test System
25 RFID Tag, Typical, not part of this RFID Tag Test System
27a Support Bracket
27b Support Bracket
29 Baffle Positioning Mechanism
31 Secondary Antenna
33 Secondary Upstream Baffle
35 Secondary Downstream Baffle
37 Secondary Position Sensor (Shaft Encoder)
39 Secondary Optical Sensor
41 Secondary Marker
43 Secondary Support Bracket
45 Secondary Baffle Positioning Mechanism
47 Primary Far Side Baffle
49 Secondary Far Side Baffle
61 Software Initialization
63 Optical Sensor Check
65 Reader Reply Check
67 Overrun Error Detected
69 Position Counters Reset and FIFO Advanced
71 Position Sensor Check
73 Position Counters Updated
75 Compare Position to Test Parameter
77 Trigger Test at RFID Reader
79 Check Configuration for Stop on Test
81 Stop Web Motion
83 Remove Test Trigger at RFID Reader
85 Compare Position to Mark Parameter
91 Check FIFO Memory for Bad Tag at Head 93 Trigger Marking Device
95 Remove Trigger From Marking Device
97 Check Reader Reply for Good Tag
99 Store Bad Tag Event at FIFO Tail
101 Restart Web Motion

DETAILED DESCRIPTION

FIGS. 1 2 4 and 5

Preferred Embodiment

Figure 1:
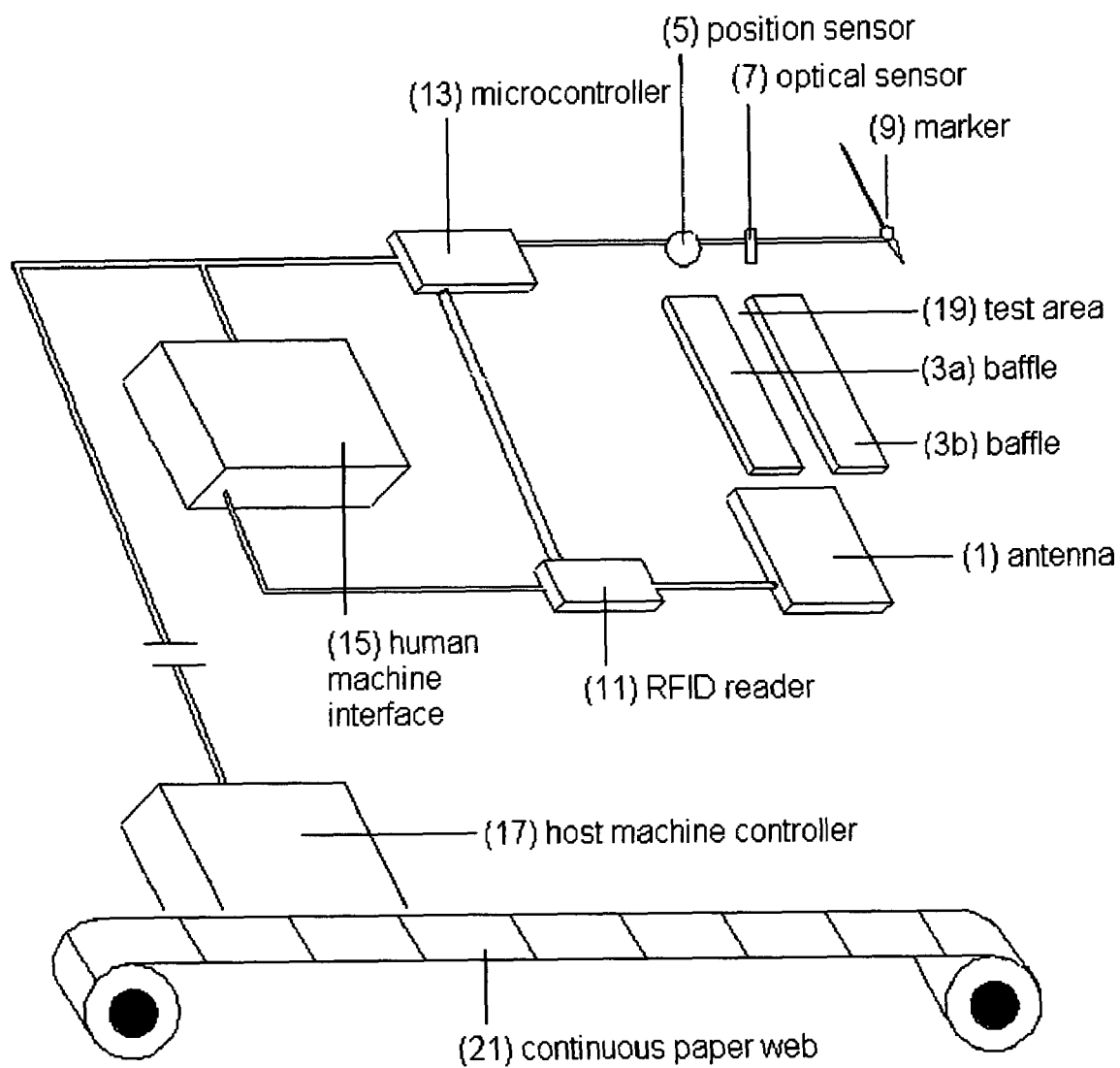
FIG. 1 is a diagram of a preferred embodiment of the invention, showing its major components.

A system diagram of the preferred embodiment is presented in FIG. 1. A standard long range antenna 1 connected to a standard RFID reader 11 is used to communicate with RFID tags on a continuous web 21. Web 21 is mounted on a machine of the sort commonly used to process continuous webs. That machine may be a conversion press, which converts inlays to tags as defined above in the prior art, or it may be a rewind table, or any of a wide range of equipment in common use. In this discussion, a "host machine" controller 17 and the web 21 are used as abstractions of that web processing machine. Despite the simplicity of this depiction, the host machine may be very complex in a real application.

Radio Frequency (RF) energy out of and into the antenna is absorbed and channeled by a pair of baffles 3a and 3b. The open space between baffles 3a and 3b, where RFID tags are visible to antenna 1, is referred to below as a "test area" 19.

As RFID tags pass through the system, their progress is monitored by sensors. A position sensor 5 is a rotating shaft position encoder driven by a wheel in contact with web 21. An optical detector 7 detects distinctive and periodic optical features of web 21.

The optical sensor and position detector are monitored in real time by a microcontroller 13. The microcontroller accepts configuration information such as label size and tag position within label from a human machine interface (HMI) 15. The microcontroller monitors the sensors and provides carefully timed trigger signals for RFID reader 11 and a marking device 9. RFID reader 11 provides one or more logical signals back to the microcontroller in response to each trigger. RFID reader 11 also has a data connection to HMI 15 over which it accepts configuration information, including tag type and test parameters, from the HMI. Over the same data connection, RFID reader 11 responds to the HMI with detailed results of each RFID tag test performed. The data connection between 11 and 15 is determined by the specific devices chosen for a given application, but are typically either RS232 serial or Ethernet LAN. Marking device 9 may be selected from a range of common, commercially available devices used to mark bad parts on an assembly line.

Figure 2:
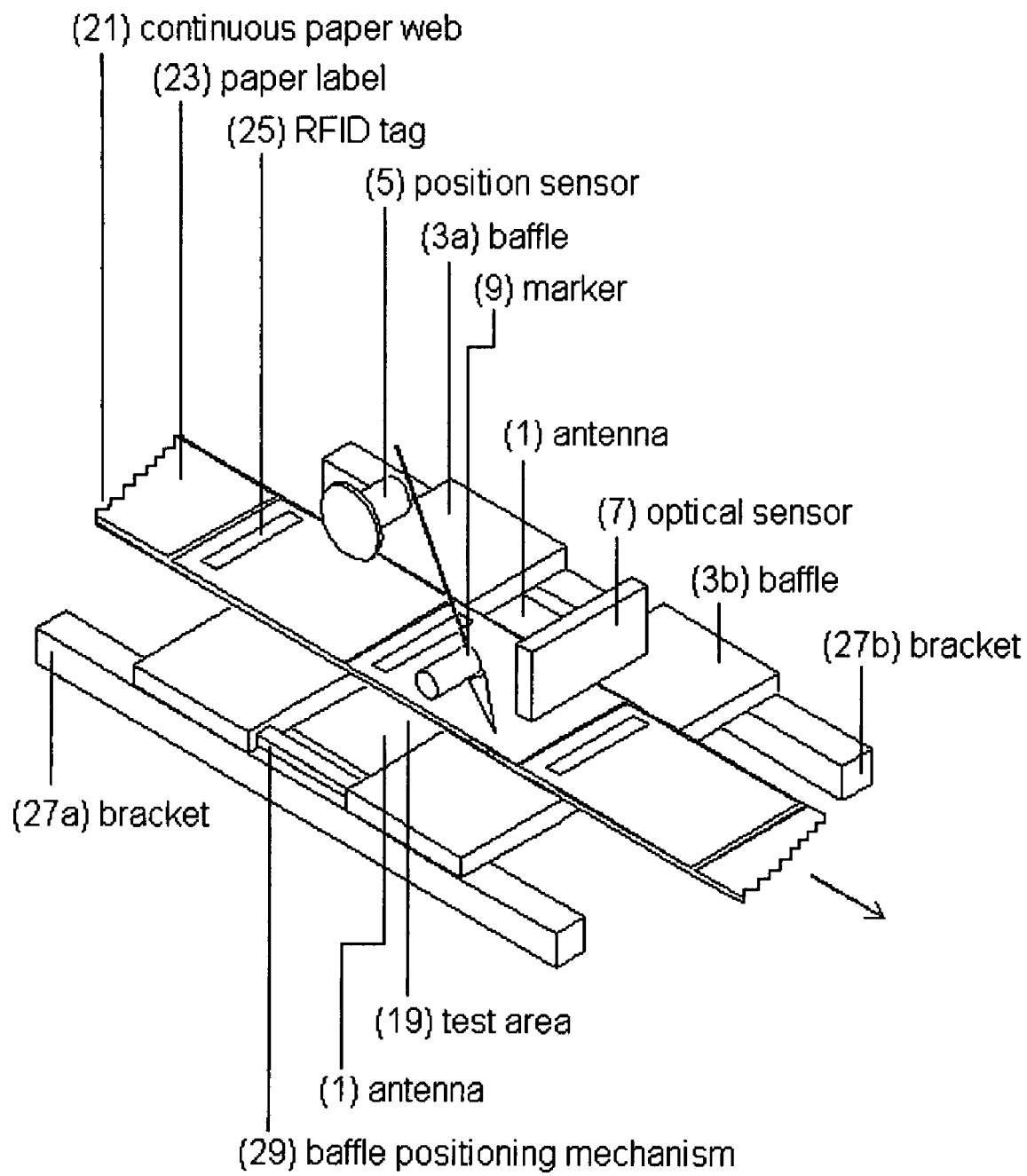
FIG. 2 shows an antenna and enclosure designed for a single continuous web of RFID.

FIG. 1 shows a logical separation between this RFID Tag Test System and its host machine. In actual installation, web 21 will always pass between baffles 3a/3b and sensors 5, 7, and 9, as shown in FIG. 2, an isometric view of a simple version of the preferred embodiment. In this view, the mounting brackets for sensors and the marking device are not shown.

In FIG. 2, antenna 1 is mounted in a support bracket shown by 27a and 27b. An actual implementation will have a more complicated support assembly. Baffles 3a and 3b are also mounted to the support brackets, along with a baffle positioning mechanism 29, which both positions the baffles and verifies the position of the baffles using an integral sensor. The antenna is mounted below the baffles, and only part of the antenna is visible in this view. Mechanism 29 may be connected to microcontroller 13 or HMI 15 as required by the application.

Position encoder 5, optical sensor 7, and marking device 9 are positioned slightly above the baffles such that a continuous web 21 can pass above the baffles and below the sensors and marker. On web 21 are mounted many instances of a paper label 23 and an RFID tag 25. The sensors or marker will be mounted in such a way as to provide required clearances or physical contact with web 21.

Figure 4:
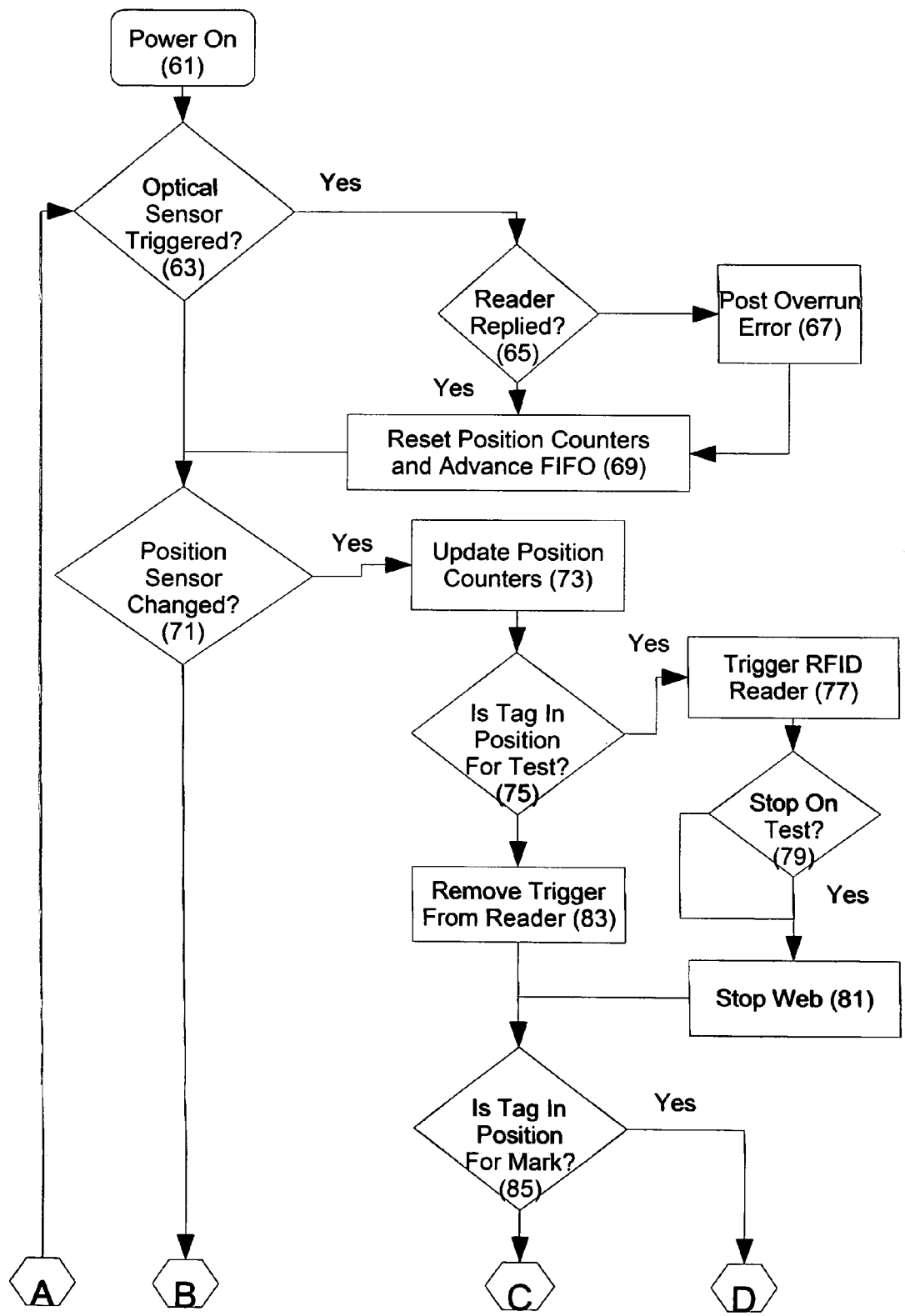
FIG. 4 is part 1 of a detailed flowchart of the microcontroller software.
Figure 5:
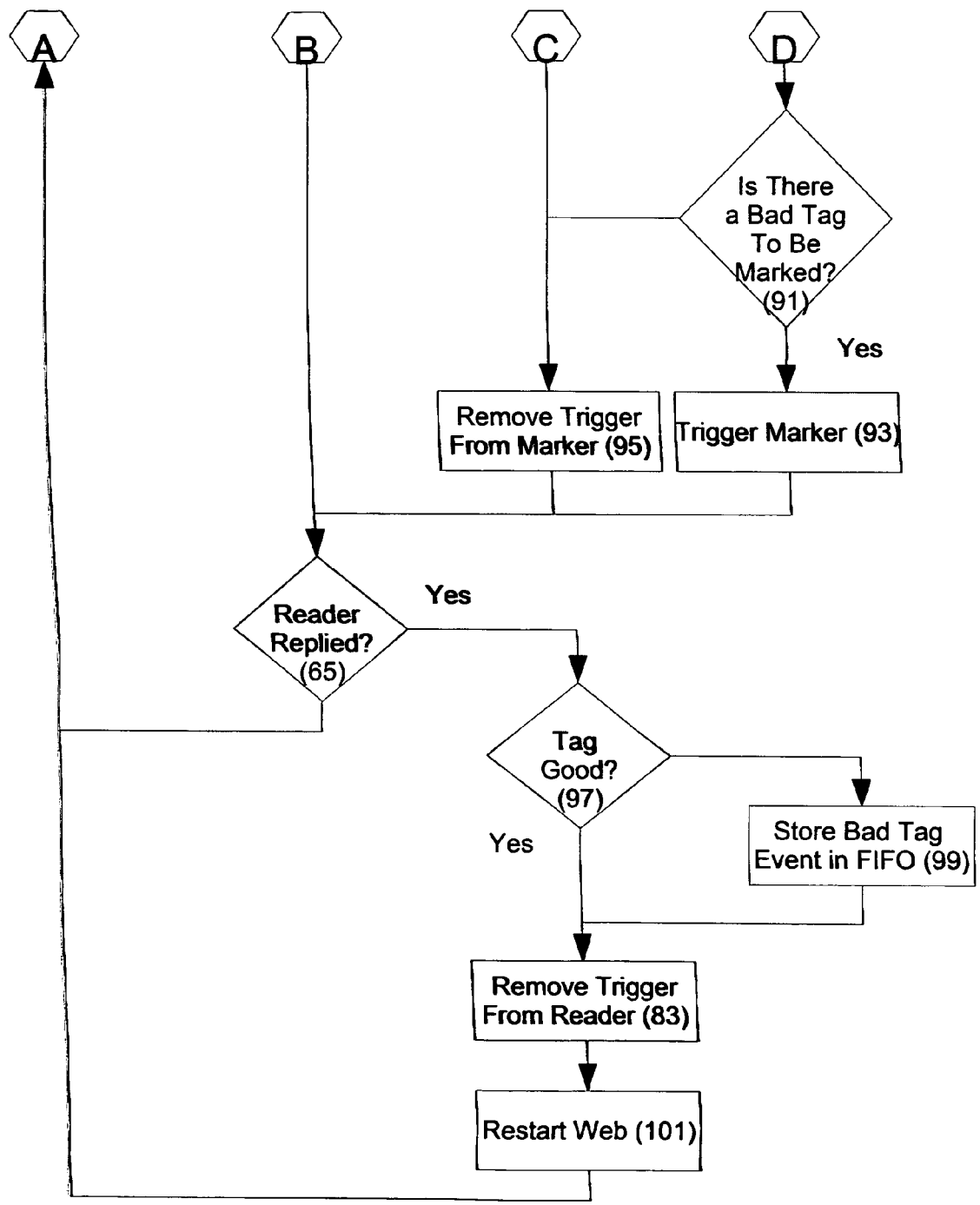
FIG. 5 is part 2 of a detailed flowchart of the microcontroller software.

A detailed block diagram of the microcontroller software that determines the behavior of this RFID Tag Test System is presented in FIG. 4 and FIG. 5. In each of those figures, hexagons are offpage connectors, diamonds are decision blocks or "checks", rectangles are action blocks and rounded rectangles are terminal points. The description below refers to a First In First Out memory, used to track bad tags for downstream processing, simply as the FIFO.

The booting and initialization of microcontroller 13, and its configuration from HMI 15, all take place in block 61 of FIG. 4. The remainder of the flowchart depicts the main processing loop of the microcontroller. For simplicity, auxiliary functions such as HMI communication and logic signal debouncing are not shown. The main loop contains three primary actions:

(a) A check of optical sensor 7 in block 63
(b) A check of position sensor 5 in block 71
(c) A check of logic return signals from RFID reader 11 in block 65

Optical sensor check 63, if positive, leads to an action block 69 and a test block 65. Block 65 is a check of the logical reply signals from RFID reader 11 to microcontroller 13. If check 65 is negative, indicating that the reader has not sent any reply in response to its last trigger, a block 67 executes.

The position sensor check 71, if positive, leads to a memory update 73 and a further check 75, in which the current position of the continuous web, synchronized with the leading edge of the current label, is compared to configured values. If this check is positive, the RFID reader 11 is triggered in a block 77. After triggering the reader, the microcontroller performs a check 79 of its configuration to determine if the web must be stopped for every test. If so, the web is stopped by a block 81. If the check 75 is negative, the trigger is removed from the RFID reader 11 by a block 83.

Similarly to block 75, a block 85 compares the current position of the continuous web, synchronized with the leading edge of the current label, to configured values. If this check is negative, the trigger to marking device 9 is removed in a block 95 of FIG. 5. If the check 85 is positive, the microcontroller must determine if a mark event is required in this cycle by a check 91 (FIG. 5) of the value at the head of the FIFO. If that check is positive, then a block 93 applies a trigger signal to marking device 9.

Check 65, performed in the main loop, leads to a decision block 97. Check 97 performs the check appropriate for the RFID reader in use, as programmed in the software and configured by the HMI. If the test result was bad, a block 99 stores the test result in FIFO memory for retrieval by block 91, 0 or more tests later.

Once a reader reply is detected, the trigger is removed from the reader by a block 83 and the web is restarted in a block 101. Execution then returns to the top of the main loop, block 63 of FIG. 4.

General Operation

FIGS. 1, 2

The most common usage of this RFID Tag Test System in a production environment will begin when an operator selects parameters at human machine interface (HMI) 15. The HMI then configures real time microcontroller 13 with the physical properties of the RFID tag web 21, 23, and 25. These physical properties may include, but are not limited to, the physical size of both the web 21 and the labels 23, along with the position of the RFID tags 25 within the labels. Other configuration information sent to the real time microcontroller by the HMI may include parameters needed to set up or interpret the output of the sensors 5 and 7, and parameters needed to properly trigger the marking device 9. At this time, the HMI will also configure RFID reader 11 with the properties of the RFID tags. These properties may include, but are not limited to, the type of tag to be tested and the specific tests to be performed. Other configuration information sent to the real time microcontroller by the HMI may include the power level and receiver sensitivity to be used for those tests.

Next, the continuous web of RFID tags is threaded through the RFID Tag Test System between the baffles and the sensors, as shown in FIG. 2. For this discussion, the assembly shown in FIG. 2 is assumed to be mounted to a machine that processes continuous webs of flat RFID tags in paper labels. That machine may the press that creates the web, a rewind system that further processes the webs, or any other web processing equipment. When the equipment is started, the continuous web of RFID tags moves through the RFID Tag Test System in the direction shown by the arrow in FIG. 2. As the web moves past the sensors, the optical sensor 7 will detect some feature of the continuous web, for example the translucent gap between labels, index marks printed on the label stock, or the opaque silhouette of the RFID tag inside the label. The microcontroller 13 will react to this event by initializing its position counters, thus the signal from optical detector 7 is used to synchronize the position information developed from position sensor 5. As the web continues to move relative to the sensors, the position sensor 5 will continuously update the microcontroller with the new position of the web. The microcontroller 13 will react to these events by updating its position counters and continuously evaluating whether it is time to test a tag or mark a bad tag.

Baffles 3a and 3b are constructed of some material that absorbs moisture. That moisture does the actual work of RF absorption. The baffles may be made of wood, fiberboard, silica gel packs, or any other material that absorbs moisture and meets the mechanical requirements of the application. When in contact or close proximity with an RFID tag, the baffles and the moisture therein perform the further function of altering the electrical characteristics of the tag, including its resonant frequency, such that the tag will not respond to RF energy at its designed frequency. This is in direct contrast to the prior art, which uses specialized and expensive RF absorptive material for the same purpose, and which further relies on full RF absorption by the shielding material rather than the more subtle effect of altering the tag's electrical characteristics as described here.

The dimensions of test area 19, formed by antenna 1 and baffles 3a and 3b, are critical to the operation of this RFID Tag Test System. The test area must be narrow enough to ensure physical isolation of tags, i.e., that one tag and only one tag are active at a given time. At the same time, the test area must be wide enough to ensure the longest possible transit time for each tag through test area 19. The time that an individual tag is in test area 19 determines the maximum possible speed at which host machine 17 can move web 21 without generating overrun errors. Baffle positioning mechanism 29 must adjust the width of test area 19, according to configuration information provided by HMI 15, which is in turn based on the physical characteristics of web 21 and tags 25.

FIG. 2 shows the continuous web of RFID tags positioned such that one RFID tag has just entered test area 19. Based on configuration information and sensor inputs described above, the real time microcontroller 13, at this instant, sends a trigger signal to the RFID reader 11, which performs the test configured at the beginning of operations by the HMI 15. At the end of the test, the reader sends a logic signal (typically TTL levels, 0 to 5 VDC) indicating good or bad tag response to microcontroller 13. The reader then sends a data signal (typically Ethernet LAN or RS232 serial) to HMI 15, containing full details of the test just executed. The details may include but are not limited to the unique identifier of the RFID tag, a quality indicator showing how good or bad the tag was, and an explicit statement of GOOD or BAD result.

When a given RFID tag is identified as bad by the RFID reader, the tag may be marked for removal by a human operator, or removed mechanically by a mechanism beyond the scope of this RFID Tag Test System. In all figures, and in this discussion, marking device 9 indicates the actuator for both possibilities. FIG. 2 shows an RFID tag and label positioned for testing, with the label directly below the marking device. This is the simplest case, in that the bad tag can be marked as soon as the test returns a bad result. However, it will not always be possible to so position labels in relation to the marker. Some labels may be shorter than the distance between the antenna and the marker, making it necessary for the microcontroller to remember which tags are bad for later marking. This requirement becomes more important if the RFID Tag Test System interfaces with marking equipment that is already part of the host machine, downstream of the test point on the continuous web. Because of this requirement, this RFID Tag Test System includes the previously mentioned First In First Out (FIFO) memory mechanism that stores bad test results. Each bad result is entered at the tail of the FIFO. When the web 21 is in the right position for marking, the microcontroller checks the head of the FIFO to see if a previously tested bad tag is in the correct location for marking. The FIFO is advanced as each new tag 25 enters test area 19, based on inputs from the optical and position sensors.

If RFID reader 11 does not provide a result by the time RFID tag 25 has left test area 19, then a fault condition exists. This fault condition may occur when the continuous web is moving too fast. It can also happen if the RFID reader 11 loses power after being configured by the HMI 15. This RFID Tag Test System detects this fault condition and takes a number of configurable actions in response, including stopping web 21.

FIG. 4 and FIG. 5 present a detailed flowchart of the main processing performed by microcontroller 13. While some obvious details like the configuration interface to HMI 15 are left out, the flowchart presents the unobvious aspects of this RFID Tag Test. System in enough detail for a skilled practitioner to understand and duplicate it.

When power is applied to microcontroller 13, it initializes and accepts configuration from HMI 15 in block 61. It then enters its main loop processing starting with block 63 in which it checks the output of optical sensor 7.

When optical sensor 7 detects a new RFID tag 25 entering test area 19, block 65 checks for reply signals from RFID reader 11. Different RFID readers may signal good and bad test results differently. Some may have a good output only, requiring the microcontroller to assume the test was bad after some elapsed time. Other readers may have explicit Good and Bad logical outputs, or a two bit Data and Clock arrangement. If the RFID reader 11 has not replied to its last trigger by the time the next RFID tag comes into view, as determined by block 65, that is regarded as an overrun error. Error actions in block 67 may include raising an alarm, or slowing or stopping the web. Depending on the application, the overrun errors may also be generated from position sensor 5 inputs or by detection of elapsed time since the reader trigger event (i.e., a "timeout"). In all cases, when the optical sensor detects a new RFID tag entering the test area, block 69 resets the counters that record web position based on position sensor 5, synchronizing the position memory with discrete optical features of the continuous web. The same block advances the FIFO memory that records the position of bad tags for marking or other action downstream of the test point.

When position sensor 5 updates the position of the continuous web, the microcontroller updates its internal memory 73 of that position accordingly. For simplicity, this flowchart does not show special handling for backwards or oscillatory motion of the continuous web, but presents events as they occur with continuous forward motion.

In block 75, the current position of the continuous web, justified to the beginning of the label currently in test area 19, is compared to the value configured by HMI 15 as the desired start position for an RFID tag test. When, as shown in FIG. 2, the current RFID tag has just entered the test area, RFID reader 11 is triggered by block 77. This trigger will generally be a TTL level (0-5 VDC) logical signal from microcontroller 13 to RFID reader 11. The trigger, however, can also take a number of alternate forms depending on the design of RFID reader 11. It may be a different type of logic signal such as 110 VAC or current loop. The trigger might also be the last character of a previously transmitted command, for example if RFID reader 11 has two serial ports, and HMI 15 has already furnished most of a test command to one port, then microcontroller 13 could complete the test command very quickly, at exactly the right time for the test, over a second serial connection between 13 and 11.

Also in response to a positive result of check 75, this RFID Tag Test System performs further checks its configuration in block 79. Some applications involving long duration tests may require host machine 17 to stop for the duration of the test. In these applications, the microcontroller 13 will be configured to "stop on test" by HMI 15. If that configuration has been made, check 79 will have a positive result and block 81 will execute, stopping continuous web 21 by sending a Stop signal to host machine 17. The nature of this signal will vary based on the characteristics of host machine 17, but will generally be a logical signal similar to that produced by an emergency stop button.

The test performed by RFID reader 11 when triggered by microcontroller 13 may take a number of forms based on the capabilities of RFID reader 11, RFID tag 25, and the application. Tag 25 may simply be read to ensure that it has not been damaged during the conversion process. Tag 25 may alternately be read a number of times and found to be good only after it responds some fraction of those times. Tag 25 may alternately be read at a number of permutations of frequency, power level, or other parameter under control of RFID reader 11, and found to be good only after it responds some subset of those permutations. Tag 25 may have a value written to it and then read back for verification, and found to be good if that value can be read back correctly. These and similar operations on RFID tags are known as "functional tests."

If continuous web 21 is not in the correct position for tag testing, as determined by a negative result from check 75, then block 83 will remove the trigger signal previously applied to reader 11 by block 77.

Next, the current position of continuous web 21, justified to the beginning of the label currently in the test area 19, is compared in block 85 to the value configured by the HMI as the desired start position for the marking, removal or other action on bad tags. If the web is so positioned, the result of check 85 will be positive, and block 91 will inspect the head of the FIFO used to track bad tags. The depth of this FIFO is configured by HMI 15. When a bad tag is detected, a bad tag event is inserted at the tail of the FIFO by block 99. Each time a new tag goes through test area 19, the FIFO is advanced one place by block 69. When block 91 inspects the FIFO, the value at the head of the FIFO will be TRUE if a bad tag is in range of the marker on this test cycle, and FALSE if a good tag is in that position. If a bad tag is in range of the marker, then block 93 will apply a trigger signal to the marking device. As previously noted, the marking device may be an actual marker, or a mechanical device that replaces bad labels in real time. Depending on the application, the marking device may also be an alarm, or a stop signal to host machine 17.

If the result of check 85 is negative, meaning that web 21 is not in mark position, then the trigger previously applied to the marker by block 93 is removed by block 95.

Finally, each time through the main loop, block 65 checks to see if reader 11 has replied to the trigger applied by block 77. If the reader has replied with a bad result, or enough time has passed without a good result, then the tag currently in test area 19 is regarded as bad and a bad tag event is entered at the tail of the FIFO by block 99. If reader 11 has replied with any result, or enough time has passed since block 77 applied the trigger, then block 83 ends the read cycle by removing the trigger from the reader, and block 101 restarts continuous web 21 by removing any stop signal to host machine 17 that may have been applied by block 81.

FIG. 3

Additional Embodiment

Figure 3:
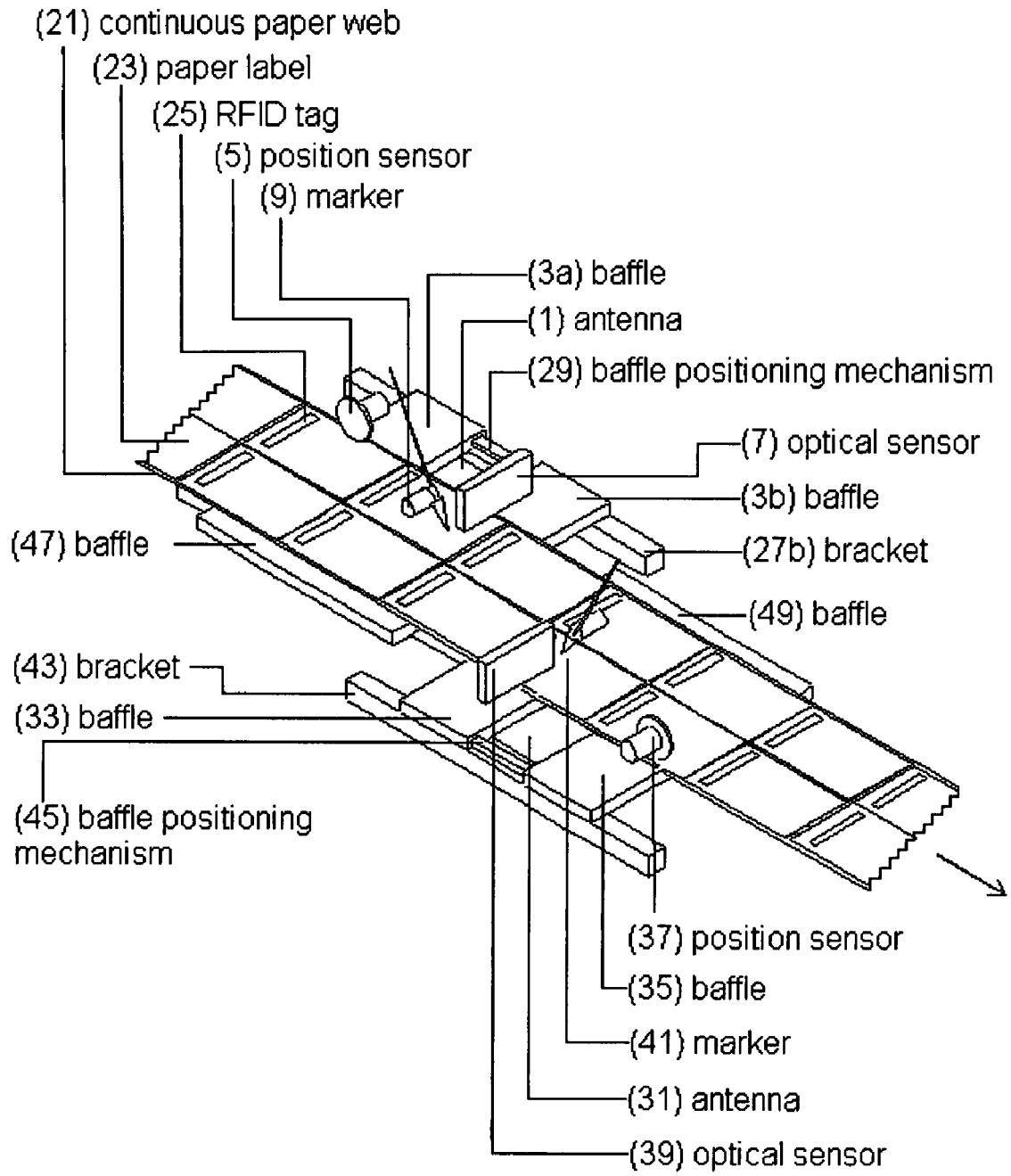
FIG. 3 shows two antennas and enclosure designed for a double continuous ("two-up") web of RFID tags.

FIG. 3 presents an isometric view of a system for testing a continuous web with two rows of RFID tags, commonly called a "two-up" web. This system contains the components of FIG. 2 along with a second set of those same components, 31 through 45, positioned to test the second set of RFID tags. One new component is introduced in this embodiment. A primary far side baffle 47 suppresses the tag opposite the tag being tested by the primary or upstream assembly. A secondary far side baffle 49 performs the same function for the secondary or downstream assembly.

Systems with more than two rows of RFID tags, for example four-up systems, can be implemented similarly by replicating the main components of the one-up system and adding baffling to suppress tags other than the one under test at each stage.

Alternative Embodiments

While the above RFID Tag Test System contains many specificities, these should not be construed as limitations on the scope of the RFID Tag Test System, but rather as an example of one preferred embodiment of the invention. Many variations are possible, including but not limited to the following:

(a) This RFID Tag Test System can be modified to light an operator indicator (e.g., a red light) in the event of bad tags, instead of marking the bad tags. This would be useful on a high speed press where the tags will be retested and replaced in further processing, but the press operator needs immediate feedback about the tags at the time of their manufacture.

(b) This RFID Tag Test System can be modified to stop the continuous web after some number of consecutive bad tags, alerting the operator to a fault condition.

(c) This RFID Tag Test System can be modified to stop the continuous web when a tag is in position for testing, allowing tests of long time duration to be executed on tags even when they are very close together. One prototype of this invention is being used to run a rewind table, which is normally runs continuously, in stop-start mode. The test in this case is the programming and verification of each RFID tag on the web.

(d) This RFID Tag Test System could be fitted to the output of a barcode printer, giving it RFID capabilities as a retrofit. In this configuration, the quality of the printer output could be inspected by the optical sensor, and the printer stopped or an alarm sounded if the printer is printing poorly.

(e) This RFID Tag Test System could be fitted to the input of an RFID capable barcode printer, screening RFID tags as they enter the printer.

(f) This RFID Tag Test System could be mounted on a purpose built, light duty and inexpensive rewind or traction device for screening of RFID labels by the purchaser after delivery. The traction device would be used for labels that were delivered in fanfold form rather than roll form.

(g) With appropriate selection of sensors, mounting, and baffles, this RFID Tag Test System can be used with continuous webs of RFID inlays as opposed to finished tags in paper labels. It can also be used with continuous webs of finished goods containing RFID tags, for example amusement park pass bracelets or automotive key blanks on a tape. It can also be used with discrete parts at predictable intervals on a conveyor belt or other continuous conveyance.

ADVANTAGES

From the description above, a number of advantages of this RFID test system become evident:

(a) The RFID Tag Test System makes use of standard, commercially available RFID readers to perform complex functional tests of RFID tags in real time.

(b) The RFID Tag Test System can be easily attached to equipment that manufactures finished RFID tags, allowing enterprises to begin RFID manufacturing with their existing equipment.

(c) The RFID Tag Test System uses commonly available RF components, like the same antennas used for long range RFID applications, instead of RF components specialized for short range work like the antennas commonly used in RFID printers. The result is better performance for a lower cost.

(d) The RFID Tag Test System uses commonly available and inexpensive moisture absorptive materials for control of RF energy, instead of specialized and expensive RF absorptive materials. The result is better performance for a lower cost.

(e) The RFID Tag Test System has a very simple interface to the host machine. In most cases, one Stop signal, similar to the emergency stop on most large machines, will support complex testing. In many cases, for example counting and monitoring applications with no control functions, no electrical interface to the host machine will be needed. This simplicity of this interface makes the RFID Tag Test System easy and economical to deploy.

Accordingly, the reader will see that this RFID Tag Test System can be used to test RFID tags quickly and accurately, at low cost and high reliability, in a number of seemingly disparate applications.

Although the present RFID Tag Test System has been described in relation to particular embodiments thereof, many other variations and modifications and other uses will become apparent to those skilled in the art. It is preferred therefore, that the present RFID Tag Test System be limited not by the specific disclosure herein, but only by the appended claims.

I claim:

1. An apparatus for functional testing of Radio Frequency Identification Devices (RFID tags), and for identifying bad RFID tags, on a continuous web passing through said apparatus, comprising:

(a) a long range antenna suitable for communication with said RFID tags, (b) a plurality of baffles for restricting the radio frequency (RF) field created by said antenna, (c) an optical sensor for detecting boundaries of RFID tags passing through said RF field, hence past said baffles and said antenna, thereby providing a coarse indication of a position of said RFID tags relative to said antenna, (d) a sensor for detecting the position of said individual RFID tags as they pass through said optical sensor, thereby providing a fine indication of the position of said RFID tags relative to said antenna and said optical sensor, (e) a support bracket suitable for holding said antenna, said baffles, said optical sensor and said position sensor in the correct orientation relative to said continuous web of RFID tags for each element to function per its specific requirements, (f) said support bracket being physically joined to said antenna, said position sensor, and said optical sensor so that said continuous web of RFID tags may be moved past said antenna, said position sensor, and said optical sensor, (g) an RFID reader suitable for communication with said RFID tags through said antenna, (h) a microcontroller suitable for real time monitoring of said optical sensor and said position sensor as well as real time control of said RFID reader, (i) said microcontroller being electrically connected to said reader so that triggering signals may be applied to said reader, and reply signals monitored from said reader, (j) said microcontroller being electrically connected to said optical sensor and said position sensor in order to monitor their signals.

2. The apparatus in claim 1, further including a device to mark, remove, or otherwise identify bad RFID tags, under the control of said microcontroller.

3. The apparatus of claim 1, further including a visible or audible alarm to indicate bad RFID tags, under the control of said microcontroller.

4. The apparatus of claim 1, further including a visible or audible alarm to indicate when said RFID reader has failed or is responding too slowly.

5. The apparatus of claim 1, further including a Human Machine Interface (HMI) comprising:

(a) an electrical connection to a digital computing device such as a Personal Computer (PC), Programmable Logical Controller (PLC) or other device suitable for the task, to be known as the HMI Platform, (b) HMI software appropriate to the HMI Platform which configures said microcontroller, monitors the status of said microcontroller, configures said RFID reader, monitors the status of said RFID reader, presents said status to a human operator, and provides means for said operator to control said microcontroller and said RFID reader.

6. The apparatus of claim 5, further including HMI software which records, or logs, the results of functional tests of each of said RFID tags, for review by human operators or query by other software such as database systems or data collection middleware.

* * * * *